United States Patent [19]
Hill

[11] Patent Number: 6,054,828
[45] Date of Patent: Apr. 25, 2000

[54] CIRCUITRY AND METHODS FOR ADJUSTING AND SWITCHING THE GAIN OF A DIGITAL-TO-ANALOG CONVERTER IN A DISK DRIVE

[75] Inventor: John P. Hill, Nederland, Colo.

[73] Assignee: STMicroelectronics, N.V., Netherlands

[21] Appl. No.: 09/216,623

[22] Filed: Dec. 16, 1998

[51] Int. Cl.[7] ............................ G05B 11/01; G05B 13/00; G11B 7/00
[52] U.S. Cl. ........................ 318/560; 318/561; 369/44.35; 369/44.36
[58] Field of Search ..................................... 318/560–696; 369/44.35, 44.36, 44.25, 44.32, 54, 50, 94, 32, 44.28; 360/78.07, 78.04, 78.09

[56] References Cited

U.S. PATENT DOCUMENTS

| | | | |
|---|---|---|---|
| 4,977,551 | 12/1990 | Minami et al. | 369/44.25 |
| 5,195,067 | 3/1993 | Yanagi | 369/32 |
| 5,559,770 | 9/1996 | Hiroki et al. | 369/44.35 |
| 5,862,113 | 1/1999 | Tsuyuguchi et al. | 369/50 |
| 5,914,829 | 6/1999 | Kadlec et al. | 360/78.04 |
| 5,963,520 | 10/1999 | Kubo et al. | 369/54 |
| 5,963,524 | 10/1999 | Tokiwa et al. | 369/58 |

*Primary Examiner*—Paul Ip
*Attorney, Agent, or Firm*—Theodore E. Galanthay; Lisa K. Jorgenson; Steven H. Slater

[57] ABSTRACT

Disclosed is a tracking control integrated circuit (IC) system implementation and method for controlling the gain of a digital-to-analog converter in a disk drive system. The tracking control IC system includes components defined in integrated circuit chips and components defined on a printed circuit board. The tracking control IC system is configured to be implemented in a disk drive system that includes a disk media. The tracking control IC system includes a servo controller chip that includes a compensator/processor, the digital-to-analog converter, and a switch. The switch is configured to receive a high gain signal (being Low or High) for setting the switch in an open state or a closed state. The tracking control IC system further includes a power amplifier chip having amplifying elements. The power amplifier chip has a first input and a second input, both of which connect to selected ones of the amplifying elements. The digital-to-analog converter includes a first output that is in communication with the switch and the first input of the power amplifier chip. The digital-to-analog converter has a second output that is in communication with the switch, and the switch has an output that is coupled to the first input of the power amplifier chip through the selected amplifying elements. The switch therefore enables the tracking control IC system to have a wider dynamic range control voltage Vc without increasing the die area of the servo control chip, without adding external active components to the PCB, and without increasing the control signal's susceptibility to noise pickup or offsets.

26 Claims, 2 Drawing Sheets

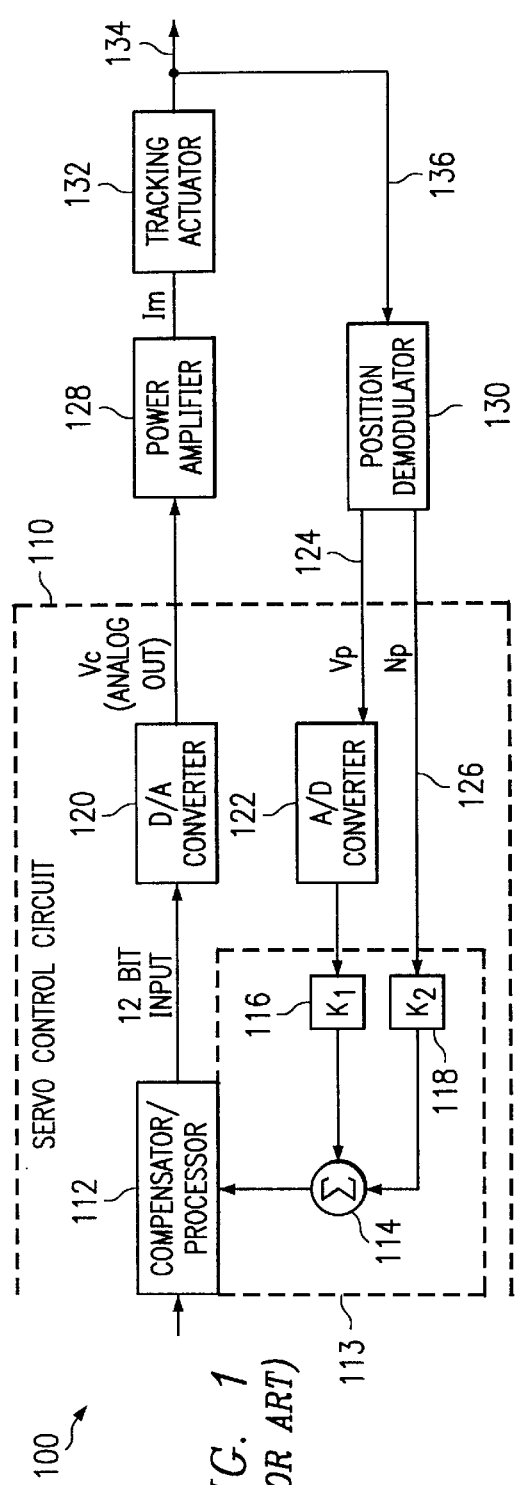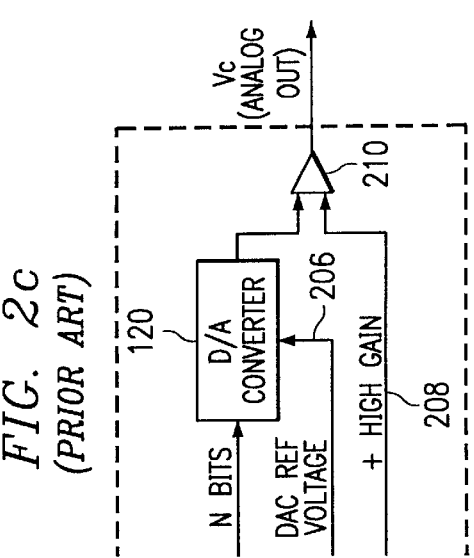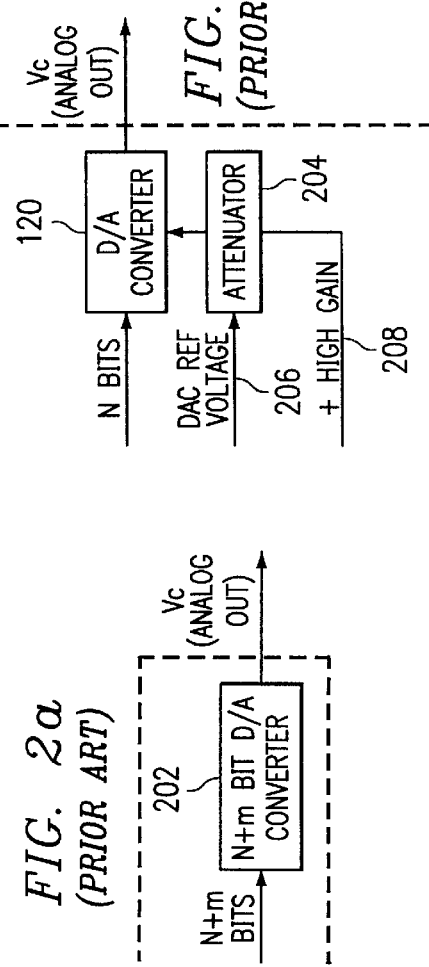

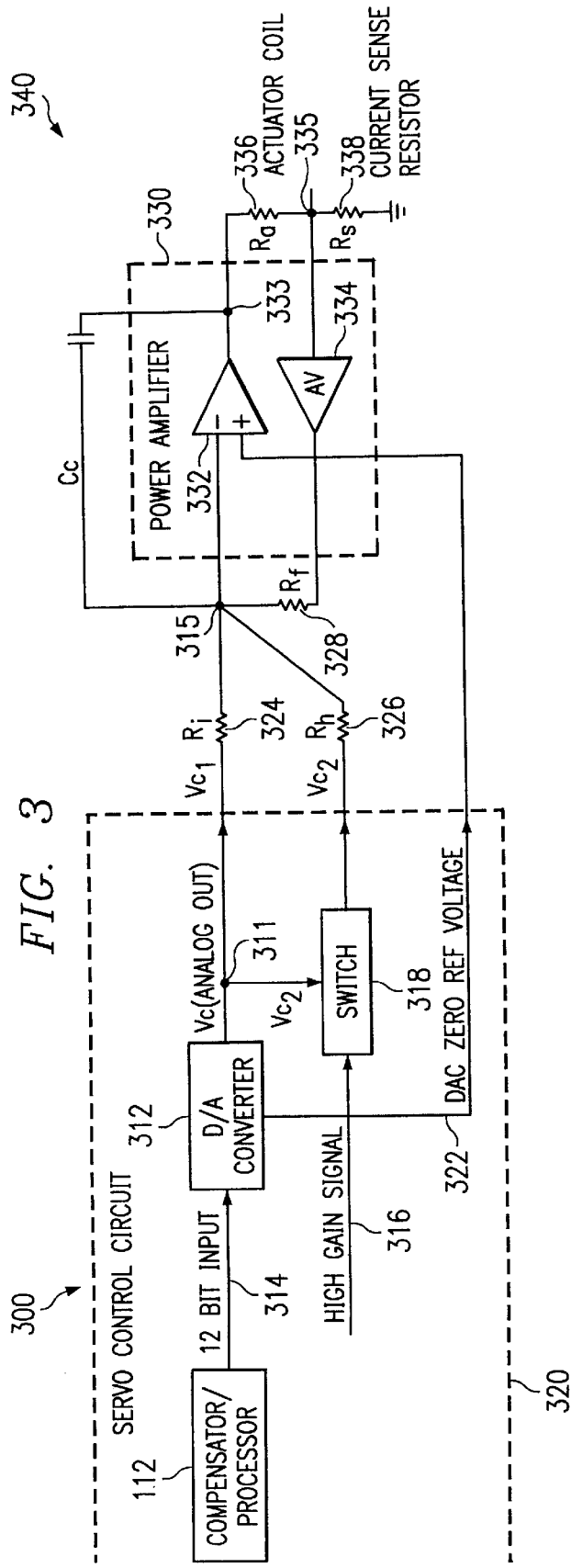
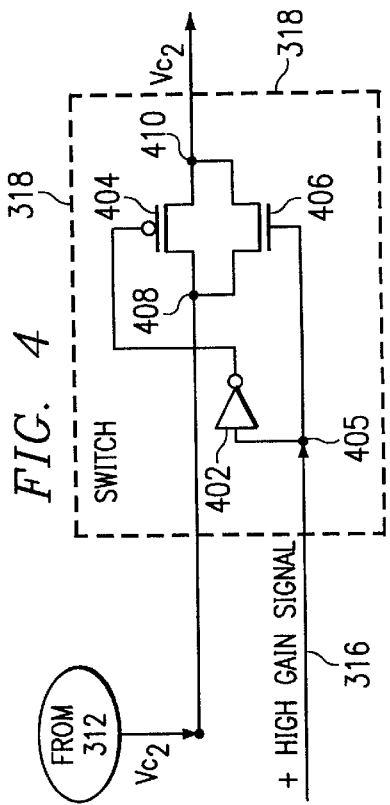
FIG. 3
FIG. 4

CIRCUITRY AND METHODS FOR ADJUSTING AND SWITCHING THE GAIN OF A DIGITAL-TO-ANALOG CONVERTER IN A DISK DRIVE

BACKGROUND OF THE INVENTION

1. Field of the Invention

The present invention relates, in general, to tracking control systems that may be used in controlling the position of an actuator and a read/write head of a computer mass storage device, such as a disk drive. More particularly, the present invention relates to circuitry and methods for increasing the dynamic range of a signal used in the tracking system to control the read/write head actuator of the disk drive.

2. Description of the Related Art

Most computer systems typically include one or more disk drives for storing and retrieving data. In general, they include a randomly accessible rotating storage medium (e.g., disk platters) on which data is encoded. Typically, most disk drives will have several disks that are spanned by an equivalent number of read/write heads that are grouped together and move as a single unit.

The read/write head is mounted on an actuator arm that is attached to a voice coil motor (VCM) capable of moving the read/write head assembly across the disk surface at a high speed to the desired data track. Controlled by the track control or servo system, the voice coil motor will "seek" to the selected track and when the head reaches the selected track, the control system performs a "track following" function that positions and maintains the read/write head over a centerline of the selected track.

The seek and track following functions impose different constraints on the servo or track control system. During a seek operation, the actuator must move as fast as possible to minimize the time required to get the read/write head to the approximate location where the desired track lies. Thus, velocity, trajectory and arrival characteristics of the actuator are the determining control factors for this function. During the track following function, on the other hand, it is the accuracy with which the read/write head can be made to follow the centerline of the data track that is important.

FIG. 1 is a block diagram illustrating a typical track control system used in a disk drive to position an actuator/head over the desired data track. As shown, the track control system 100 includes a servo controller 110, a power amplifier 128, a position demodulator 130, and a tracking actuator 132. The servo controller 110 includes a processor and a compensator circuit or code 112 that generates a 12-bit command word in response to a request from the processor. The command word is 12 bits in this example but could be other widths. The 12-bit command word is sent to a digital-to-analog converter 120. The digital-to-analog converter 120 converts the command to its analog equivalent or control voltage Vc, and transmits it to the power amplifier 128. The magnitude of the voltage supplied to the power amplifier 128 determines whether the actuator will perform a "seek" or a "track-follow." This is due to the fact that the voltage required to initially accelerate or move the actuator to the appropriate data track is greater than the voltage required to keep the actuator over the centerline of the data track. Once received, the power amplifier 128 amplifies the voltage Vc and generates a proportional current output Im that is transmitted to the tracking actuator 132. The proportional current output Im therefore causes a proportional acceleration or movement of the actuator.

FIG. 1 also shows the feedback mechanism used to adjust and maintain the position of the read/write head over the data track. Control information embedded in the data provides inter-track positioning information so that a head positioning error, indicative of the difference between the estimated head position and the desired head position is sent from tracking actuator 132 to the position demodulator 130. The position demodulator 132 extracts both a positioning error voltage Vp at 124 and a track number Np at 126 from the head positioning error. The positioning error Vp 124 is converted into digital data by the analog-to digital-converter 122. Once converted, the positioning error Vp and the data track number Np are processed by the appropriate scaling gains 116, 118 and summed together at 114 and forwarded to the compensator/processor circuit 112. This scaling and summing is typically done in the compensator code by the processor. FIG. 1 shows how the scaling and summing functions would be performed within a dotted line 113 to the compensator/processor circuit 112. In response to the head position error, compensator/processor circuit 112 adjusts the control voltage to either move the actuator to another data track or adjust the read/write head to the proper position over the centerline of the desired data track.

In response to high consumer demand for higher performing hard drives, drive manufacturers have been building disk drives with an increased number of tracks which are laid-out with an increased level of density. Unfortunately for designers of tracking control systems, this places an increased demand for speed during seek operations as well as more precise track following operations. As a result, the ability of a control system to efficiently move the read/write head to the appropriate track and maintain the read/write head over the centerline of the data track is becoming more difficult.

One approach that may be taken to improve performance is to increase the dynamic range of the control voltage Vc produced by the digital-to-analog converter 120. FIGS. 2a through 2c illustrate several conventional approaches which may be attempted to increase the dynamic range. FIG. 2a illustrates a technique that implements a digital-to-analog converter 202 that is able to accommodate a processor command with a greater number of control bits (i.e., N+m Bits). By doing this, the range or swing of the control voltage Vc is increased while minimizing the errors normally found in signals generated by digital-to-analog converters used in this environment. The problem with this approach is that it does not overcome the system noise problems inherent with generating control voltages with greater dynamic range. In addition, the die size of the digital-to-analog converter typically doubles for every bit added to the command word, thus, increasing the size and the cost of such a component.

FIG. 2b shows another conventional technique that can be used to increase the dynamic range of the control voltage Vc generated by the digital-to-analog converter 120. As shown, an attenuator 204 and an associated reference voltage 206 (DAC Ref. Voltage) controls the input of the digital-to-analog converter 120. Depending on the desired positioning function (i.e., seek or track-follow), the digital-to-analog converter 120 will receive either a high or low level reference signal from the attenuator 204. In this technique therefore, the voltage reference that sets the signal swing is modified by the attenuator 204, which is a switchable attenuator. Thus, the digital-to-analog converter 120 will produce the appropriate range or swing of the control voltage Vc. This implementation does allow designers to reduce the die area of the tracking control system, but also has the downside of increasing digital-to-analog conversion errors. Such errors include, for example, a substantial increase in linearity errors that are introduced by the digital-to-analog converter 120 when in the track-following mode. This increase in linearity errors will therefore cause a substantial decrease in control during track-following operations. Unfortunately, it is during track-following that the greatest level of control and accuracy is needed in order to ensure that the read/write head is well positioned over the centerline of a given track. Further yet, the technique of FIG. 2b does not address the issues of system noise.

FIG. 2c illustrates another technique that may be used for increasing the dynamic range of the control signal Vc. Here, the reference voltage 206 is supplied directly to the digital to analog converter 120. This keeps dynamic range or swing of the control voltage Vc constant. To modify the constant Vc, a variable gain amplifier 210 is implemented to shift between the seek mode and the track-follow mode. Unfortunately, this technique also fails to address the problem of noise pickup or offsets.

In further attempts to increase the dynamic range of the control voltage Vc, designers may integrate additional components, such as attenuators and switches, directly on the printed circuit board (PCB) that is also configured to receive the servo controller 110 in the form of an integrated circuit (IC) chip. Some of these external components will therefore include active devices, such as field effect transistors (FETs) or FET switch ICs. As is well known, when active devices are integrated directly onto the PCB, an added level of cost and complexity is introduced into the design. More specifically, this external integration of active components can have the unfortunate downside of increasing the cost of the entire tracking control system because the PCB components are known to significantly add to the cost of an IC solution, and increased engineering design is typically needed to ensure that the IC chip properly interfaces with the PCB components.

In view of the foregoing, there is a need for circuitry and methods that enable a wider dynamic range control signal between a digital-to-analog converter and a power amplifier within a disk drive tracking control system. There is also a need for circuitry and methods that enable the increase in dynamic range without increasing the die size of the circuitry and without requiring external PCB active components. In addition, a needed also exists for circuitry and methods that provide for an increased dynamic range in the generated control signal without increasing the control signal's susceptibility to noise pickup or offsets.

SUMMARY OF THE INVENTION

Broadly speaking, the present invention fills these needs by providing a method and circuitry that increases the dynamic range of the control signal used in the tracking control system without increasing the die size of a servo chip, without adding active external components, and without increasing the control signal's susceptibility to noise pickup or offsets. It should be appreciated that the present invention can be implemented in numerous ways, including as a process, an apparatus, a system, a device, a method, or a computer readable medium. Several inventive embodiments of the present invention are described below.

In one embodiment, a tracking control integrated circuit device that includes components that are defined in integrated circuit chips and components defined on a printed circuit board is disclosed (see FIG. 3). The tracking control integrated circuit device is configured to be implemented in a disk drive system that includes a disk media. The tracking control system includes a servo controller chip that has a compensator/processor, a digital-to-analog converter, and a switch. The switch is configured to receive a high gain signal for controlling one of an open state and a closed state of the switch. The tracking control integrated circuit device further includes a power amplifier chip having amplifying elements. The power amplifier chip has a first input and a second input, both of which connect to selected ones of the amplifying elements. The digital-to-analog converter includes a first output that is in communication with the switch and the first input of the power amplifier chip. The digital-to-analog converter has a second output that is in communication with the amplifying elements, and the switch has an output that is coupled to the first input of the power amplifier chip.

In this embodiment, when the switch is closed, the first output (Vc) of the digital-to-analog converter will be communicated to the first input (315) of the power amplifier chip via a pair of resistors connected in parallel, thereby placing the tracking control device in the seek mode. When the switch is open, the first output (Vc) will only be coupled to the first input (315) of the power amplifier chip via a single series resistor, thereby placing the tracking control device in the track-follow mode. In this preferred embodiment, parallel connected resistors Ri and Rh (in seek mode) and the series resistor Ri (in track-follow mode) will be integrated on a PCB that is also configured to receive the servo control chip and the power amplifier chip. This tracking control device is preferably integrated into a disk drive device.

In another embodiment, a method for controlling an actuator that positions a read/write head over a data track of a disk media. The method includes: (a) receiving a multi-bit command word (e.g., 12-bit command word), input from a processor that is configured to define a desired data track to access over the disk media; (b) converting the multi-bit command word from a digital signal to a control voltage signal that is passed to a switch and a power amplifier; (c) controlling the switch by a high gain signal that is configured to cause the switch to be placed in one of a closed state and an open state; and (d) converting the control voltage signal from the digital-to-analog convertor into a control voltage signal that is communicated to the power amplifier. The converting is such that an increased current is generated by the power amplifier when the switch is in the closed state and that a decreased current is generated by the power amplifier when the switch is open. The method of this embodiment further includes seeking to the desired data track when the increased current is generated by the power amplifier, and track following over an approximate centerline of the desired data track when the decreased current is generated by the power amplifier.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 1 is a block diagram illustrating a typical track control system used in a disk drive to position an actuator/head over the desired data track.

FIGS. 2a through 2c illustrate several conventional approaches which may be attempted to increase the dynamic range of a voltage control signal.

FIG. 3 illustrates a block diagram of the tracking control system in accordance with one embodiment of the present invention.

FIG. 4 illustrates a more detailed circuit diagram of the switch of FIG. 3, in accordance with one embodiment of the present invention.

DETAILED DESCRIPTION OF THE PREFERRED EMBODIMENTS

An invention is described for circuitry and methods for enabling a tracking control system to achieve wider dynamic ranges in control voltage without increasing the die size of a servo chip, without adding active external components, and without increasing the control signal's susceptibility to noise pickup or offsets. It will be obvious, however, to one skilled in the art, that the present invention may be practiced without some or all of these specific details. In other instances, well known process operations have not been described in detail in order not to unnecessarily obscure the present invention.

In the following description, exemplary circuit diagrams that provide significant advantages over the prior art discussed above will be presented. In general, the tracking control system of FIGS. 3 and 4, are well suited to provide a wider dynamic range control signal Vc between a digital-to-analog converter 312 of a servo control circuit 320 and a power amplifier 330. This increased dynamic range is provided without increasing the size of the IC chip embodying the servo control circuit 320, and without the need for adding external active components on a printed circuit board (PCB) 340. The embodiments of the present invention also increase the dynamic range without increasing the control signal's susceptibility to noise pickup or offsets. Furthermore, these significant performance increases are provided without the need to increase the performance requirements of a standard digital-to-analog converter 312 of a tracking control system of FIG. 3.

Referring to FIG. 3, a block diagram of the tracking control system 300 is shown in accordance with one embodiment of the present invention. The tracking control system 300 includes a servo control circuit 320 and a power amplifier 330, which are integrated onto the printed circuit board (PCB) 340. The Servo control circuit 320 is preferably in the form of an integrated circuit chip which is then attached to the printed circuit board via a suitable packaging arrangement that will facilitate communication to other components integrated on the printed circuit board 340. The power amplifier 330 is also preferably an integrated circuit chip which can be integrated onto the printed circuit board 340 in a similar manner as the servo control circuit 320.

The servo control circuit 320 includes a compensator/processor 112 which is suited to provide a 12-bit input in the form of a command word. The compensator/processor 112 typically receives digital information from an interface device which is suited to deliver to the compensator/processor 112 information sufficiently configured to inform the tracking control system 300 of a desired location on a disk media to be accessed by the tracking control system 300. The 12-bit input 314 is then communicated to a digital-to-analog converter 312 that is also part of the servo control circuit 320.

The digital-to-analog converter 312 can be any suitable digital-to-analog converter that can perform appropriate voice coil converting (e.g., also known as a VCMDAC). Also included in the servo control circuit 320 is a switch 318 which is integrated along with other standard IC chip transistor devices and wired by standard IC interconnect metallization. The digital-to-analog converter 312 is shown having a first output in the form of an analog signal (i.e., Vc) that is communicated to the power amplifier 330 as well as the switch 318 by way of a node 311.

After the node 311, the analog control voltage Vc signal is pictorially designated as Vc1 and Vc2. Each of the voltages Vc1 and Vc2 are, at that point, identical to the control voltage Vc provided as an output of the digital-to-analog converter 312. The switch 318 is also shown receiving a high-gain signal 316 from the processor which may be in the form of a logical 0 or a logical 1, depending upon whether the switch 318 is desired to be placed in an open state or a closed state, respectively. If the switch 318 is placed in the closed state, the control voltage Vc2 is passed through the switch and communicated to the power amplifier 330 while the control voltage Vc1 is also communicated to the power amplifier 330 (i.e., over two parallel lines). The parallel lines will therefore enable the passing of the control voltage Vc through a first resistor (i.e., Ri) 324 and a second resistor (Rh) 326, and the parallel lines terminate at a power amplifier node 315. The two parallel lines carrying the control voltages Vc1 and Vc2 will therefore provide a resistance between the servo control circuit 320 and the power amplifier 330 that is reduced in accordance with a parallel resistor combination. That is, Rh will be in parallel with Ri, which lowers the effective resistance to (Ri*Rh/Ri+Rh). Thus, the gain of the power amplifier 330, which is defined by Keq/(Ri*Rh/Ri+Rh) is increased to enable rapid seek mode operations. Keq, is in this example, defined by Rf/Av*Rs.

When the high-gain signal 316 is provided in the form of a logical 0 to the switch 318, the switch will shift into the open state, thereby eliminating the path for the control voltage Vc2 through the second line to the power amplifier 330. More specifically, the switch 318 will therefore prevent, in response to the controlling high gain signal 316, the parallel resistor combination that is achieved when the switch is in the closed state. When the switch is open, the resistance between the digital-to-digital converter 312 and the power amplifier node 315 will only be Ri, which produces a gain of Keq/Ri during track-follow mode operations. The signal to noise is also optimized for both modes because the gain of the power amplifier 330 can be set to the ideal level to ensure proper operation in each mode.

The digital-to-analog converter 312 is also shown having a DAC Zero reference voltage 322 that is in communication with the power amplifier 330. This signal is typically in the voltage range of ground or one-half of the signal circuitry power supply minimum value. The power amplifier 330, as shown, includes amplifying elements. The amplifying elements preferably include an operational power amplifier 332 and a gain amplifier Av 334. In this embodiment, therefore, the DAC Zero reference voltage 322 is coupled to the positive terminal of the operational power amplifier 332. The gain amplifier is shown arranged in a feedback orientation such that it will include a gain input node 335 and a gain output node that is coupled to the power amplifier summing node 315 through a reference resistor (Rf) 328.

In this embodiment, the power amplifier summing node 315 is shown coupled to the operational power amplifier 332 within the power amplifier 330. The power amplifier summing node 315 therefore defines a first input into the power amplifier 330 and also defines the input at which either an increased current command will be passed to the power amplifier 330 when in the seeking mode, and a point at which a decreased current command will be received when in the track-following mode. Of course, when track-following operations are performed, the switch 318 will be in the open state by way of providing a logical 0 via the high gain signal 316.

The power amplifier 330 is also shown including a compensation capacitor (Cc) that interconnects an output node 333 of the operational power amplifier with the power amplifier node 315. Also shown is an actuator coil resistor (i.e., Ra) 336 which is interconnected between the output node 333 and the gain input node 335. Between node 335 and a ground connection, a current sense resistor (i.e., Rs) 338 is provided.

As mentioned above, the servo control circuit 320 and the power amplifier 330 are both preferably integrated in the form of an integrated circuit (IC) chip. However, passive devices, such as the first resistor 324, the second resistor 326, the reference resistor 328, the current sense resistor 338, and the coupling capacitor Cc are integrated as components on the printed circuit board 340. Because these passive devices are substantially less expensive than active devices to integrate over a printed circuit board 340, the added cost of integrating such passive devices will not substantially increase the cost of the tracking control system, and are typically provided on the printed circuit board to allow for optimization adjustments.

This is particularly important in view of the growing need for competitively priced high performance disk drives with high density media. Thus, for disk media having a high track density, a wider dynamic range afforded by the tracking control system 300 will enable for more precision control of a read/write head over a desired track during both seeking and track following.

Therefore, during the seek mode, the switch 318 will be placed into the closed state, thereby introducing an increased current command at the power amplifier node 315 that is provided to the power amplifier 330. When the system is desired to be placed in the track-follow mode, the switch 318 is placed into its open state thereby providing a standard current command that is less than that provided during seeking at the power amplifier node 315.

It should be noted that most digital-to-analog converters, such as digital-to-analog converter 312 will typically introduce quantizing and linearity errors that are inherent in the conversion operation. As an advantage of the present invention, when the dynamic range is increased to provide the increased current during seeking operations, such quantization errors and linearity errors are not proportionately increased, when switching back to the track-following mode. This therefore provides substantial benefits in that a wider dynamic range is achieved, but the typical quantization errors and linearity errors that can hamper the performance of the tracking control system 300 are prevented from increasing. In addition, the tracking control system 300 will also be less susceptible to noise susceptibility and offsets due to the fact that such increases in dynamic range will not increase noise nor offsets merely because the system is placed into the track-following mode.

FIG. 4 illustrates a more detailed circuit diagram of the switch 318 in accordance with one embodiment of the present invention. In this embodiment, the switch 318 is shown receiving the control voltage signal Vc2 from the digital-to-analog converter 312. The control voltage Vc2 is then communicated to a node 408. The voltage is therefore held at node 408 when the switch is in an open state and allowed to be communicated to a node 410 when the switch is placed in the closed state. Also, the high gain signal 316 is shown coupled to a node 405 within the switch 318.

Node 405 defines an input to an inverter 402 that has an output that is coupled to a gate of a P-channel transistor FET 404. The node 405 is also coupled to a gate of an N-channel FET 406. The source and drain of each of the P-channel transistor FET 404 and the N-channel transistor FET 406 are therefore tied together at nodes 408 and 410. Depending upon the digital value, logical 1 or logical 0, the switch 318 will function to either close or open the switch 318 that provides a path for the control voltage Vc2 to pass through the switch and be communicated through the second resistor 326 as shown in FIG. 3.

Alternatively, if the switch 318 is kept in an open state, the control voltage Vc will only pass control voltage Vc1 through the first resistor 324 as shown in FIG. 3. In operation, the switch 318, when a logical 1 is passed to node 405, will communicate the logical 1 to the gate of the N-channel transistor FET 406 and the input of the inverter 402. The inverter 402 will therefore invert the logical 1 into a logical 0 which is passed to the gate of the P-channel transistor FET 404. At that point, the transistors will be in an ON state, thereby enabling the switch to be in the closed state. Alternatively, if the high-gain signal provides a logical 0 to node 405, the logical 0 will be communicated to the gate of N-channel transistor 406. At the same time, that logical 0 will be provided as an input to the inverter 402. The inverter 402 will therefore convert the logical 0 into a logical 1 and communicated to the gate of the P-channel FET 404. At that time, the switch 318 will be shifted into an open state and thereby prevent the control voltage Vc2 to be passed through the switch 318.

In summary, it should also be understood that the embodiments of the present invention will provide a greater dynamic range with regard to the voltage swing of the control voltage Vc. This greater dynamic range is achieved without adding active components on the printed circuit board 340. This is an important benefit because when active components are added to the printed circuit board 340 in a design incorporating semiconductor IC chips, the overall cost of the design will substantially increase due to the greater cost of the active devices and the additional design and manufacturing required to enable proper communication with other integrated circuit chips designed and integrated onto the printed circuit board 340. Furthermore, the embodiments of the present invention provide this wider dynamic range without increasing the susceptibility to noise pickup on the control signal between the DAC 312 and the external power amplifier 330. This wider dynamic range is further achieved without increasing the performance requirements of standard 12-bit DAC or increasing the performance of other system components.

The present invention may be implemented using any type of integrated circuit logic, state machines, and/or software driven computer-implemented operations. By way of example, a hardware description language (HDL) based design and synthesis program may be used to design the silicon-level circuitry necessary to appropriately perform the data and control operations in accordance with one embodiment of the present invention. By way of example, a VHDL® hardware description language available from IEEE of New York, N.Y. may be used to design an appropriate silicon-level layout.

The invention may employ various computer-implemented operations involving data stored in computer systems to drive computer peripheral devices (i.e., in the form of software drivers). These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit device including components defined in integrated circuit chips and components defined on a printed circuit board, the integrated circuit device is configured to be implemented in a disk drive system that includes a disk media, the integrated circuit device comprising:

a servo controller chip including a compensator/processor, a digital-to-analog converter, and a switch, the switch is configured to receive a high gain signal for controlling one of an open state and a closed state of the switch; and a power amplifier chip including amplifying elements, the power amplifier chip includes a first input and a second input, both of which connect to selected ones of the amplifying elements, the digital-to-analog converter having a first output that is in communication with the switch and the first input of the power amplifier chip, the digital-to-analog converter having a second output that is in communication with the amplifying elements, and the switch has an output that is coupled to the first input of the power amplifier chip.

2. An integrated circuit device as recited in claim 1, further comprising:

a first resistor being integrated between the digital-to-analog converter and the power amplifier chip, which is defined between the first output of the digital-to-analog converter and the first input of the power amplifier chip; and a second resistor being integrated between the switch and the power amplifier chip, which is defined between the output of the switch and the first input of the power amplifier chip.

3. An integrated circuit device as recited in claim 2, wherein the first resistor and the second resistor are components defined on the printed circuit board, and electrically interface between servo controller chip and the power amplifier chip.

4. An integrated circuit device as recited in claim 1, wherein the amplifying elements include an operational power amplifier and a gain amplifier, the operational power amplifier has a first operational input that is coupled to the first input of the power amplifier chip and a second operational input that is coupled to the second input of the power amplifier chip, and the operational power amplifier has an output node.

5. An integrated circuit device as recited in claim 4, wherein the gain amplifier has a gain input node and a gain output node, the gain output node is coupled to the first input of the power amplifier chip.

6. An integrated circuit device as recited in claim 5, further comprising:

a third resistor being connected between the gain output node of the gain amplifier and the first input of the power amplifier chip;

wherein the third resistor is a component defined on the printed circuit board.

7. An integrated circuit device as recited in claim 5, further comprising:

an actuator coil resistance that is coupled between the output node of the operational power amplifier and the gain input node of the gain amplifier;

wherein the actuator coil resistance is a model for an actuator motor coil.

8. An integrated circuit device as recited in claim 7, further comprising:

a current sense resistor that is coupled between the gain input node of the gain amplifier and a ground connection.

9. An integrated circuit device as recited in claim 7, further comprising:

a compensation capacitor being connected between the output node of the operational power amplifier and the first input of the power amplifier chip; and wherein the compensation capacitor is a component defined on the printed circuit board.

10. An integrated circuit device as recited in claim 1, wherein the switch further comprises:

a logic inverter having an inverter input and an inverter output, the inverter input is coupled to the high gain signal; and a transistor pair including a p-channel transistor and an n-channel transistor, the p-channel transistor has a p-channel gate that is connected to the inverter output, and the n-channel transistor has an n-channel gate that is connected to the high gain signal.

11. An integrated circuit device as recited in claim 10, wherein when a digital high is communicated to the high gain signal, the both the p-channel transistor and the n-channel transistor are ON, thereby closing the switch and passing the first output of the digital-to-analog converter through the switch.

12. An integrated circuit device as recited in claim 10, wherein when a digital low is communicated to the high gain signal, the both the p-channel transistor and the n-channel transistor are OFF, thereby opening the switch and preventing the first output of the digital-to-analog converter to pass through the switch.

13. An integrated circuit device as recited in claim 11, wherein when the switch is closed, a control voltage is converted into a control current upon passing through the first resistor and the second resistor, and a magnitude of a resulting resistance is defined by:

$$\{Ri(\text{the first resistor})*Rh(\text{the second resistor})\}/\{Ri(\text{the first resistor})*Rh(\text{the second resistor})\}.$$

14. An integrated circuit device as recited in claim 12, wherein when the switch is open, a control voltage is converted into a control current upon passing through only the first resistor, and a magnitude of a resulting resistance is defined by:

Ri(the first resistor).

15. A method for controlling an actuator that positions a read/write head over a data track of a disk media, comprising:

receiving a multi-bit command word input from a processor that is configured to define a desired data track to access over the disk media;

converting the multi-bit command word from a digital signal to a control voltage signal that is passed to a switch and a power amplifier;

controlling the switch by a high gain signal that is configured to cause the switch to be placed in one of a closed state and an open state; and converting the control voltage signal into a control current command that is communicated to the power amplifier, the converting is such that an increased current command is received by the power amplifier when the switch is in the closed state and that a decreased current command is received by the power amplifier when the switch is open.

16. A method for controlling an actuator that positions a read/write head over a data track of a disk media as recited in claim 15, wherein the high gain signal is configured to provide one of a logical 0 and a logical 1.

17. A method for controlling an actuator that positions a read/write head over a data track of a disk media as recited in claim 16, further comprising:

providing the logical 0 through the high gain signal in order to cause the switch to be in the open state.

18. A method for controlling an actuator that positions a read/write head over a data track of a disk media as recited in claim 16, further comprising:

providing the logical 1 through the high gain signal in order to cause the switch to be in the closed state.

19. A method for controlling an actuator that positions a read/write head over a data track of a disk media as recited in claim 15, further comprising:

seeking to the desired data track when the increased current command is received by the power amplifier.

20. A method for controlling an actuator that positions a read/write head over a data track of a disk media as recited in claim 19, further comprising:

track following over an approximate centerline of the desired data track when the decreased current command is received by the power amplifier;

whereby the track following is performed after the seeking.

21. A system for controlling an actuator that positions a read/write head over a data track of a disk media, comprising:

means for receiving a multi-bit command word input from a processor that is configured to define a desired data track to access over the disk media;

means for converting the multi-bit command word from a digital signal to a control voltage signal that is passed to a switch and a power amplifier;

means for controlling the switch by a high gain signal that is configured to cause the switch to be placed in one of a closed state and an open state; and means for converting the control voltage signal from the digital-to-analog converter into a control voltage signal that is communicated to the power amplifier, the converting is such that an increased current is generated by the power amplifier when the switch is in the closed state and that a decreased current command is generated by the power amplifier when the switch is open.

22. A system for controlling an actuator that positions a read/write head over a data track of a disk media as recited in claim 21, wherein the high gain signal is configured to provide one of a logical 0 and a logical 1.

23. A system for controlling an actuator that positions a read/write head over a data track of a disk media as recited in claim 22, further comprising:

means for providing the logical 0 through the high gain signal in order to cause the switch to be in the open state.

24. A system for controlling an actuator that positions a read/write head over a data track of a disk media as recited in claim 22, further comprising:

means for providing the logical 1 through the high gain signal in order to cause the switch to be in the closed state.

25. A system for controlling an actuator that positions a read/write head over a data track of a disk media as recited in claim 21, wherein the multi-bit command word is a 12-bit command word.

26. A system for controlling an actuator that positions a read/write head over a data track of a disk media as recited in claim 21, wherein the system is integrated into a hard disk peripheral device that is configured to be connected to a computer system.

* * * * *